United States Patent
Sato (10) Patent No.: US 8,760,611 B2
(45) Date of Patent: Jun. 24, 2014

(54) DISPLAY DEVICE COMPRISING A PLURALITY OF UPPER-LAYER LINES WITH EXPOSED UPPER SURFACES WHICH ARE NOT COVERED, A PLURALITY OF LOWER-LAYER LINES, AND A PLURALITY OF ADJUSTMENT LAYERS

(75) Inventor: Masashi Sato, Mobara (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 289 days.

(21) Appl. No.: 12/749,627

(22) Filed: Mar. 30, 2010

(65) Prior Publication Data

US 2010/0253898 A1    Oct. 7, 2010

(30) Foreign Application Priority Data

Apr. 3, 2009  (JP) .................. 2009-091308

(51) Int. Cl.
  *G02F 1/1345*  (2006.01)
  *G02F 1/1333*  (2006.01)
(52) U.S. Cl.
  USPC ....................................... 349/152; 349/138
(58) Field of Classification Search
  USPC ......... 349/138, 139, 140, 142, 149, 151, 152, 349/158
  See application file for complete search history.

(56) References Cited

U.S. PATENT DOCUMENTS

| 2003/0038913 | A1* | 2/2003 | Choo | 349/149 |
| 2007/0296674 | A1* | 12/2007 | Aoki et al. | 345/94 |
| 2008/0017855 | A1* | 1/2008 | Kim et al. | 257/48 |
| 2008/0186441 | A1* | 8/2008 | Ohgiichi et al. | 349/151 |

FOREIGN PATENT DOCUMENTS

| JP | 08-006057 | 1/1996 |
| JP | 08-313922 | 11/1996 |
| JP | 10-274662 | 10/1998 |
| JP | 2004-037184 | 2/2004 |
| JP | 2007-226001 | 9/2007 |
| JP | 2008-241801 | 10/2008 |

\* cited by examiner

*Primary Examiner* — Paul Lee
(74) *Attorney, Agent, or Firm* — Antonelli, Terry, Stout & Kraus, LLP.

(57) ABSTRACT

A display device at which the contact-type wiring inspection can be accurately carried out is provided. In a display device in which two or more kinds of lines are arranged on a substrate by way of an interlayer insulation film, in at least a partial region of the substrate outside a display region, a plurality of upper-layer lines which are arranged parallel to each other on an upper side of the interlayer insulation film, lower-layer lines which are arranged on a lower side of the interlayer insulation film and between the upper-layer lines or adjacent to the upper-layer lines, and adjustment layers for adjusting a height which are arranged on a lower side of the interlayer insulation film and below the upper-layer lines so as to position surfaces of the upper-layer lines at a highest position on the substrate are formed.

11 Claims, 8 Drawing Sheets

FIG.1A

PRIOR ART

FIG.1B

PRIOR ART

FIG.2A

PRIOR ART

FIG.2B

PRIOR ART

DISPLAY DEVICE COMPRISING A PLURALITY OF UPPER-LAYER LINES WITH EXPOSED UPPER SURFACES WHICH ARE NOT COVERED, A PLURALITY OF LOWER-LAYER LINES, AND A PLURALITY OF ADJUSTMENT LAYERS

CROSS-REFERENCE TO RELATED APPLICATION

The present application claims priority from Japanese application JP2009-091308 filed on Apr. 3, 2009, the content of which is hereby incorporated by reference into this application.

BACKGROUND OF THE INVENTION

1. Field of the Invention

The present invention relates to a display device, and more particularly to a display device which is suitable for contact-type wiring inspection.

2. Description of the Related Art

Various planar display devices such as a liquid crystal display device and an organic electroluminescent display device have been put into practice. In these display devices, a large number of lines are formed on a substrate in a matrix array and hence, it is inevitable to confirm a defect of a line in a manufacturing step.

As one of methods of inspecting lines, there has been known a contact-type wiring inspection in which a probe is directly brought into contact with a line. Further, also with respect to the contact-type wiring inspection, there have been known an inspection method where a large number of comb-teeth-shaped probes are simultaneously brought into contact with a plurality of lines, and an inspection method where one or several probes are scanned in the arrangement direction of lines.

SUMMARY OF THE INVENTION

In the contact-type wiring inspection, when the number of times of inspection is increased, a distal end of the probe is worn, and hence a contact defect between the probe and the line may be occurred. Particularly, the wear is remarkable in the method where the probe is scanned and hence, to accurately inspect a defect in the line, it is necessary to always maintain a distal end of the probe in a sharpened state by polishing the distal end of the probe.

On the other hand, in a display device of recent years, there has been a demand for high resolution and miniaturization of the display device, and hence there exists tendency to achieve higher densification of the arrangement of lines. Accordingly, a distal end of the probe which is used in the contact-type wiring inspection is liable to be more fine and is liable to be worn. As a result, even with the slight wear of the distal end of the probe, it is difficult to accurately inspect a defect in a line.

Figure 1A:
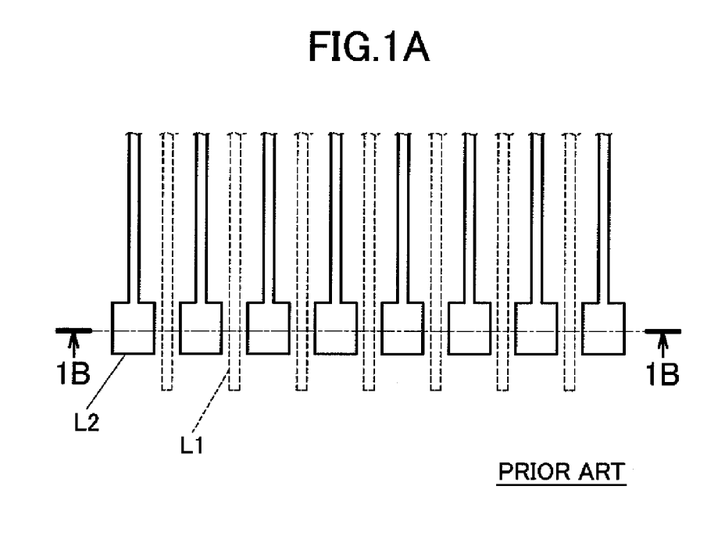
FIG. 1A is a view for explaining a normal inspection state of a contact-type wiring inspection which is applied to a conventional display device.
Figure 1B:
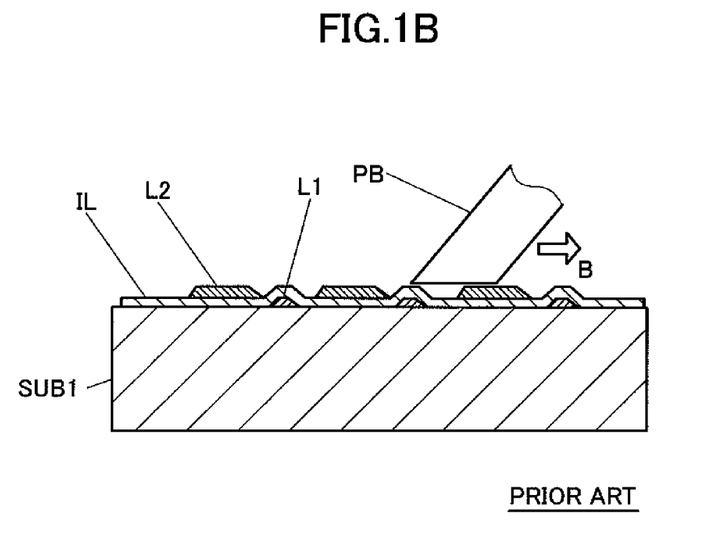
FIG. 1B is a view for explaining a normal inspection state of the contact-type wiring inspection which is applied to the conventional display device.
Figure 2A:
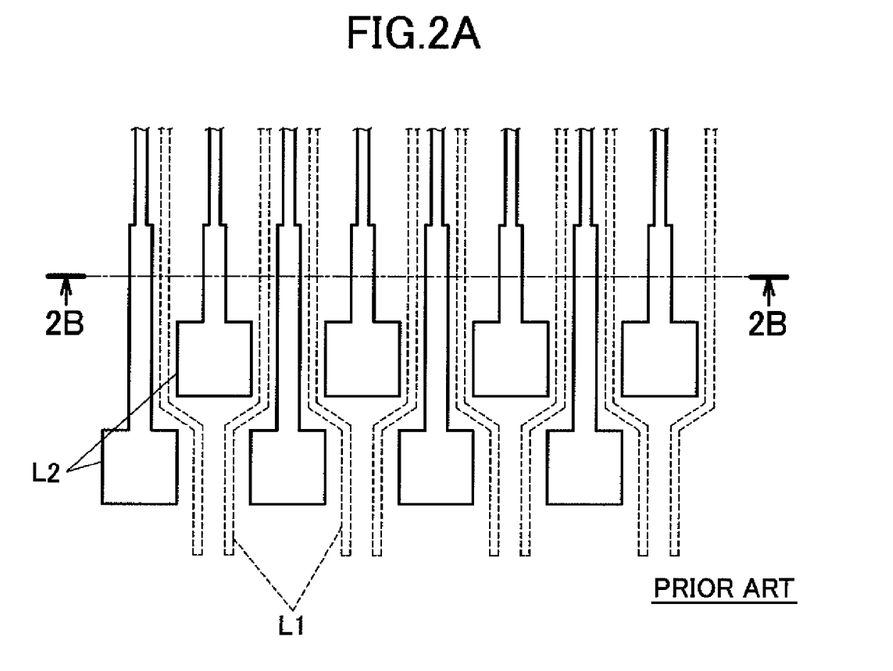
FIG. 2A is a view for explaining an abnormal inspection state of the contact-type wiring inspection which is applied to the conventional display device.
Figure 2B:
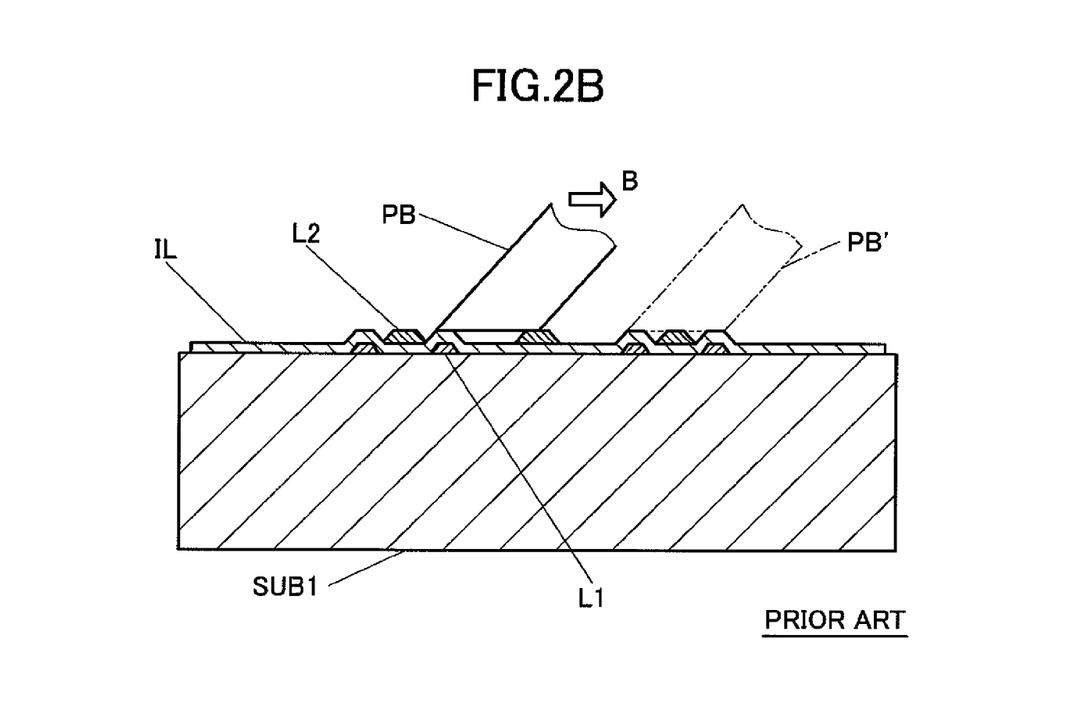
FIG. 2B is a view for explaining an abnormal inspection state of the contact-type wiring inspection which is applied to the conventional display device.

FIG. 1A to FIG. 2B are views showing a mode where lines are inspected. FIG. 1A is a plan view of the lines. FIG. 1B is a cross-sectional view showing a mode where a probe PB is scanned along a chained line in FIG. 1A. FIG. 2A and FIG. 2B are views similar to FIG. 1A to FIG. 1B.

Plural kinds of lines (L1, L2) are provided to the display device. For example, as shown in FIG. 1B, one lines L1 are formed on a substrate SUB1, an interlayer insulation film IL is formed on one lines L1, and the other lines L2 are formed on the interlayer insulation film IL. The interlayer insulation film IL is formed to avoid a conduction between the lines L1 and the lines L2. As a matter of course, the larger the number of kinds of lines becomes, the larger the number of interlayer insulation films which are formed between the respective lines becomes.

FIG. 1B shows a case where the lines L2 are inspected. To consider a case where the arrangement density of lines L1, L2 is relatively low, a case where a line width of the line L2 which constitutes an inspection object is large or the like, as shown in FIG. 1B, even when one side of a distal end of the probe PB is worn, it is possible to ensure a contact of the probe PB with every line L2. Here, an arrow B indicates the moving direction of the probe PB.

However, as shown in FIG. 2A and FIG. 2B, to consider a case where the arrangement density of lines L1, L2 is relatively high, when the lines L1 exist in the vicinity of the lines L2 which constitute inspection objects or the like, at a position where a probe PB' is arranged in FIG. 2B, a distal end of the probe PB' gets over protruding portions of the interlayer insulation film IL formed on the lines L1 thus giving rise to a possibility that the probe PB' cannot ensure a sufficient contact with the line L2. Particularly, such a drawback frequently occurs when a thickness of the line L2 is smaller than a thickness of the line L1.

It is an object of the present invention to provide a display device at which the contact-type wiring inspection can be accurately carried out.

The display device of the present invention, to overcome the above-mentioned drawbacks, has following technical features.

(1) In a display device in which two or more kinds of lines are arranged on a substrate by way of an interlayer insulation film, in at least a partial region of the substrate outside a display region, a plurality of upper-layer lines which are arranged parallel to each other on an upper side of the interlayer insulation film, lower-layer lines which are arranged on a lower side of the interlayer insulation film and between the upper-layer lines or adjacent to the upper-layer lines, and adjustment layers for adjusting a height which are arranged on a lower side of the interlayer insulation film and below the upper-layer lines so as to position surfaces of the upper-layer lines at a highest position on the substrate are formed.

(2) In the display device having the above-mentioned constitution (1), the partial region may be a region with which a probe is brought into contact at the time of performing the contact-type wiring inspection.

(3) In the display device having the above-mentioned constitution (2), the adjustment layer may be simultaneously formed with the lower-layer lines.

(4) In the display device having the above-mentioned constitution (2), the adjustment layer may be electrically isolated.

(5) In the display device having the above-mentioned constitution (3), the adjustment layer may be a connection portion which connects the lower-layer lines with each other.

(6) In the display device having the above-mentioned constitution (2), a line width of the upper-layer line and a width of the adjustment layer within the partial region may be set larger than a line width of the upper-layer line within the display region.

(7) In the display device having the above-mentioned constitution (2), the display device may be a liquid crystal display device, and the substrate may be a substrate on which thin film transistors are formed, the lower-layer lines may constitute common lines, and the upper-layer lines may constitute drain lines or gate lines.

According to the above-mentioned constitution (1), the upper-layer lines are arranged at the highest position on the substrate and hence, even when the arrangement of lines is densified or even when a distal end of a probe is worn, it is possible to surely bring the distal end of the probe into contact with the upper-layer line. Accordingly, it is possible to perform the accurate inspection in the contact-type wiring inspection.

According to the above-mentioned constitution (2), it is possible to provide the display device more suitable for the contact-type wiring inspection.

According to the above-mentioned constitution (3), it is unnecessary to separately add a step of forming the adjustment layer. Further, it is possible to easily set a thickness of the adjustment layer equal to a thickness of the lower-layer line. Accordingly, it is unnecessary to accurately adjust the thickness of the adjustment layer and hence, the manufacture of the display device can be simplified.

According to the above-mentioned constitution (4), the presence of the adjustment layer does not cause defects in operations of respective lines.

According to the above-mentioned constitution (5), when it is necessary to connect the lower-layer lines with each other as in the case of common lines of the liquid crystal display device, it is possible to use the adjustment layer as the connection portion.

According to the above-mentioned constitution (6), the probe can contact more easily in performing the contact-type wiring inspection and hence, it is possible to carry out the inspection more accurately.

According to the above-mentioned constitution (7), the wiring inspection of the liquid crystal display device using thin film transistors can be performed more accurately.

DETAILED DESCRIPTION OF THE INVENTION

A display device according to the present invention is explained in detail hereinafter. In the explanation made hereinafter, a liquid crystal display device is mainly explained as one example of the display device. However, the display device of the present invention may be any display device provided that two or more kinds of wires are arranged on a substrate by way of an interlayer insulation film. The scope of protection of the present invention covers not only the liquid crystal display device but also various kinds of display devices such as an organic electroluminescent display device.

Figure 3:
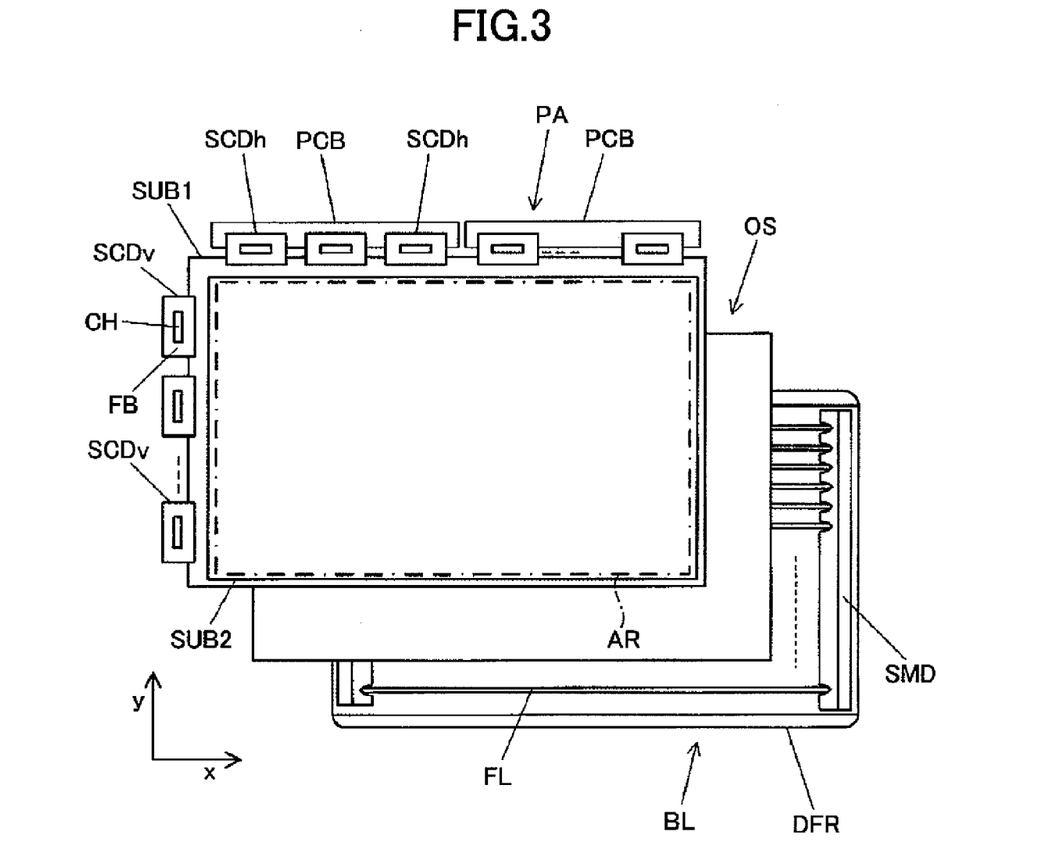
FIG. 3 is a schematic view showing the whole liquid crystal display device which is one example of the display device according to the present invention.

FIG. 3 is a schematic constitutional view of a liquid crystal display device to which the present invention is applied. In FIG. 3, a liquid crystal display panel PA, an optical sheet OS and a backlight BL are sequentially arranged in order from a viewer's side.

The liquid crystal display panel PA includes a pair of substrates SUB1, SUB2 which is made of glass, for example, and is arranged parallel to each other, and liquid crystal is sealed in a space defined between the respective substrates SUB1, SUB2.

On liquid-crystal-side surfaces of the substrates SUB1, SUB2, pixels which are arranged in a matrix array are formed, and optical transmissivity of liquid crystal can be controlled for every pixel.

A region where these pixels are formed is referred to as an image display region AR (a region surrounded by a chained line in FIG. 3). Light emitted from the backlight BL is radiated to the whole region of the image display region AR, and light which passes through the respective pixels is recognized as an image by a viewer.

The substrate SUB1 which is arranged on a depth side as viewed from a viewer's side includes exposed portions which project from a left-side edge and an upper-side edge of the substrate SUB2 in FIG. 3, for example, and a plurality of driver printed circuit boards SCDh, SCDv are connected to these portions. These driver printed circuit boards SCDh, SCDv are formed by TCP (Tape Carrier Package) which is so-called TAB (Tape Automated Bonding), COF (Chip on Film) or the like. A semiconductor chip CH is mounted on an upper surface of a flexible printed circuit board FB on which lines are formed.

The respective driver printed circuit boards SCDh, SCDv are circuits for driving the respective pixels independently. For example, the driver printed circuit boards SCDv which are arranged parallel to each other in the y direction in FIG. 3 are scanning signal drive circuits, and the driver printed circuit boards SCDh which are arranged parallel to each other in the x direction in FIG. 3 are video signal drive circuits.

With respect to the plurality of driver printed circuit boards SCDh which constitute the video signal drive circuits, a printed circuit board PCB is connected to the other side of the driver printed circuit boards SCDh opposite to one side of the driver printed circuit boards SCDh which is connected to the substrate SUB1. External input signals are inputted to the driver printed circuit boards SCDh through the printed circuit boards PCB.

Here, external input signals are inputted to the plurality of driver printed circuit boards SCDv which constitute scanning signal drive circuits through lines (not shown in the drawing) which are formed on a surface of the substrate SUB1 and hence, the driver printed circuit board SCDv does not include a circuit board corresponding to the printed circuit board PCB.

On a back surface of the liquid crystal display panel PA having such a constitution, a backlight BL is arranged by way of an optical sheet means (optical member) OS which is formed of a stacked body consisting of a prism sheet, a diffusion plate and the like, for example. The optical member OS guides light emitted from the backlight BL to a liquid crystal display panel PA side while diffusing and collecting the light.

In FIG. 3, the backlight BL is referred to as a so-called direct backlight and is constituted such that a plurality of cold cathode fluorescent lamps or external electrode fluorescent lamps which constitute a linear light sources FL are arranged parallel to each other in the inside of a box-shaped casing (frame member DFR). On both end portions of the cold cathode fluorescent lamps, a side mold SMD which covers electrode portions of the lamps and reflects light emitted from the lamps to the liquid crystal display panel PA side is arranged. The backlight BL may be formed of spot light sources such as light emitting diodes arranged in a planar shape in place of the linear light sources. Further, it may be also possible to adopt the constitution where a light source is arranged below a side (a lateral lower side) of the display panel in place of the direct backlight, and the image display region AR is illuminated by making use of a light guide plate or the like.

Figure 4:
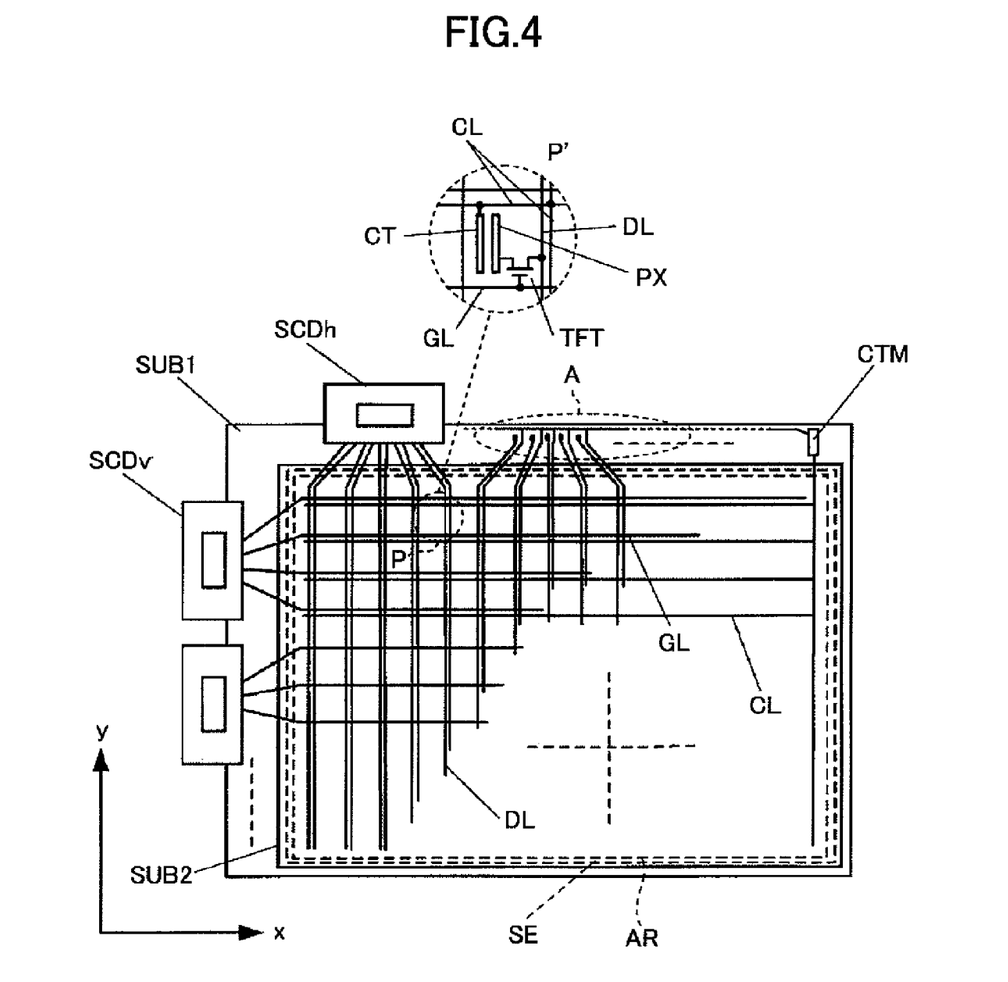
FIG. 4 is a schematic view showing the whole liquid crystal display panel which is used in a liquid crystal display device which is one of display device according to the present invention.

Next, electrodes and lines which are formed on the substrate SUB1 are explained in conjunction with FIG. 4. The substrate SUB1 has an area larger than an area of the substrate SUB2. For example, on a left side portion and an upper side portion of the substrate SUB1 shown in FIG. 4, the substrate SUB1 includes exposed regions which project from edges of the substrate SUB2.

In a region formed on the left side portion of the substrate SUB1, a plurality of driver printed circuit boards SCDv (scanning signal drive circuits) are arranged parallel to each other, while in a region formed on the upper side portion of the substrate SUB1, a plurality of driver printed circuit boards SCDh (video signal drive circuits) are arranged parallel to each other. The driver printed circuit boards SCDv constitute the scanning signal drive circuits and are connected to gate lines (gate signal lines) GL. The driver printed circuit boards SCDh constitute the video signal drive circuits and are connected to drain lines (drain signal lines) DL.

On the liquid-crystal-side surface of the substrate SUB1 and within the liquid crystal display region AR, the gate signal lines GL which extend in the x direction and are arranged parallel to each other in the y direction in FIG. 4, and the drain signal lines DL which extend in the y direction and are arranged parallel to each other in the x direction in FIG. 4 are formed.

A rectangular region surrounded by a pair of neighboring gate signal lines GL and a pair of neighboring drain signal lines DL constitutes a region where a pixel is formed. Due to such a constitution, the respective pixels are arranged in a matrix array within the liquid crystal display region AR.

Left end portions of the respective gate signal lines GL extend to the outside of the liquid crystal display region AR beyond a sealing material SE, and are connected to output terminals of the driver printed circuit boards SCDv arranged in the vicinity of the left end portions. Due to such a constitution, a scanning signal (voltage) is supplied to the respective gate signal lines GL by the driver printed circuit boards SCDv.

Upper end portions of the respective drain signal lines DL extend to the outside of the liquid crystal display region AR beyond the sealing material SE, and are connected to output terminals of the driver printed circuit boards SCDh arranged in the vicinity of the upper end portions. Due to such a constitution, a video signal (voltage) is supplied to the respective drain signal lines DL by the driver printed circuit boards SCDh.

For example, as indicated by a circle frame P' which is an enlarged view of a circle frame P in FIG. 4, the pixel includes a thin film transistor TFT which is turned on in response to a scanning signal (voltage) from the gate signal line GL, a pixel electrode PX to which a video signal (voltage) is supplied from the drain signal line DL via the thin film transistor TFT in an ON state, and a common electrode CT to which a fixed reference signal (voltage) is applied so as to generate an electric field due to potential difference between the common electrode CT and the pixel electrode PX.

The pixel electrodes PX and the common electrodes CT are formed on the same substrate SUB1, and the electric field contains an electric field component parallel to a surface of the substrate SUB1 as a part thereof. A method which operates (drives) liquid crystal molecules using such an electric field is referred to as a lateral-electric-field (In-Plane-Switching) method.

Here, a predetermined voltage is applied to the common electrodes CT via the common line CL which is arranged parallel to the gate signal line GL or the drain signal line DL. The common lines CL extend beyond the sealing material SE and are connected to a common voltage terminal CTM which is formed on the surface of the substrate SUB1.

Next, the constitution of a display device which is suitable for contact-type wiring inspection is explained. FIG. 5A to FIG. 8B are views showing a state of lines which are arranged at a portion outside the display region AR indicated by symbol A in FIG. 4. The contact-type wiring inspection is performed for inspecting a defect in a line after thin film transistors, lines, electrodes and the like are formed on a substrate SUB1. Here, the inspection which uses a probe is also adopted in an inspection of thin film transistors and electrodes.

In the display device of the present invention in which two or more kinds of lines L1, L2 are arranged on the substrate SUB1 by way of an interlayer insulation film IL, in at least one region outside a display region AR of the substrate SUB1, a plurality of upper-layer lines L2 which are arranged parallel to each other on an upper side of the interlayer insulation film IL, lower-layer lines L1 which are arranged on a lower side of the interlayer insulation film IL and between the upper-layer lines L2 or adjacent to the upper-layer lines L2, and adjustment layers D for adjusting a height which are arranged on a lower side of the interlayer insulation film IL and below the upper-layer lines L2 so as to position surfaces of the upper-layer lines L2 at a highest position on the substrate SUB1 are formed.

The adjustment layer D is not particularly limited provided that the adjustment layer D is a film body arranged below the line L2 and a surface position of the line L2 is set higher than a surface of the substrate. Accordingly, the adjustment layer D is not limited to an interlayer insulation film shown in FIG. 5A to FIG. 8B, and may be formed of another insulation film or a semiconductor film. Further, the adjustment layer D may be formed of a metal film for forming other line or electrode. In the explanation made hereinafter, the explanation is made by taking a film body D which can be formed simultaneously with the formation of the line L1 as an example. As a matter of course, by forming the adjustment layers D and the lower-layer lines L1 simultaneously, it is unnecessary to add a step of manufacturing the adjustment layers D separately. Further, it is possible to easily make a thickness of the adjustment layer D and a thickness of the lower-layer line L1 equal, and hence it is unnecessary to accurately adjust the thickness of the adjustment layer D, and hence the display device can be manufactured simply.

Figure 5A:
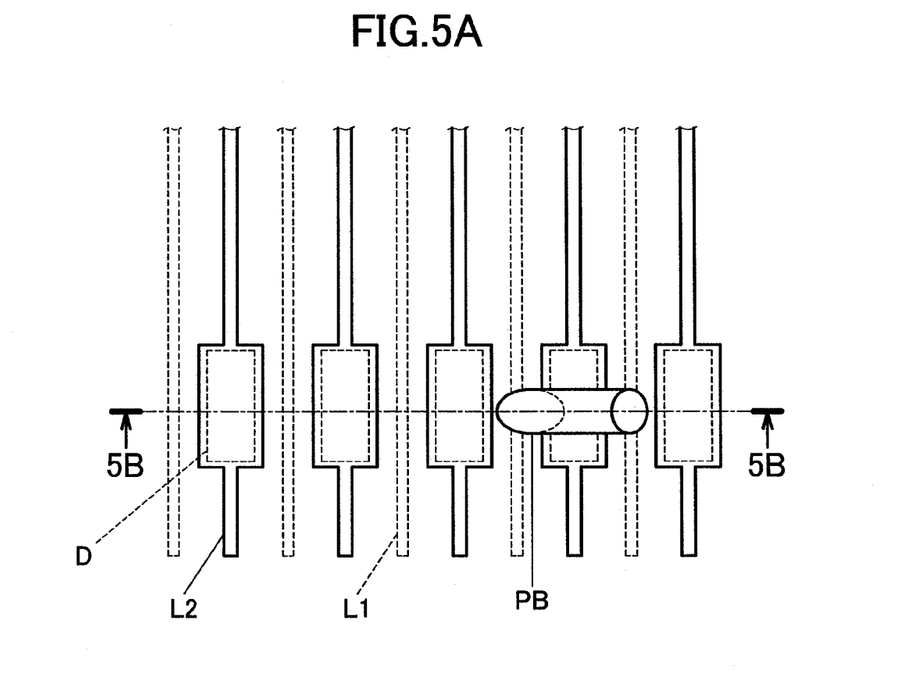
FIG. 5A is a view for explaining a display device of a first embodiment according to the present invention.
Figure 5B:
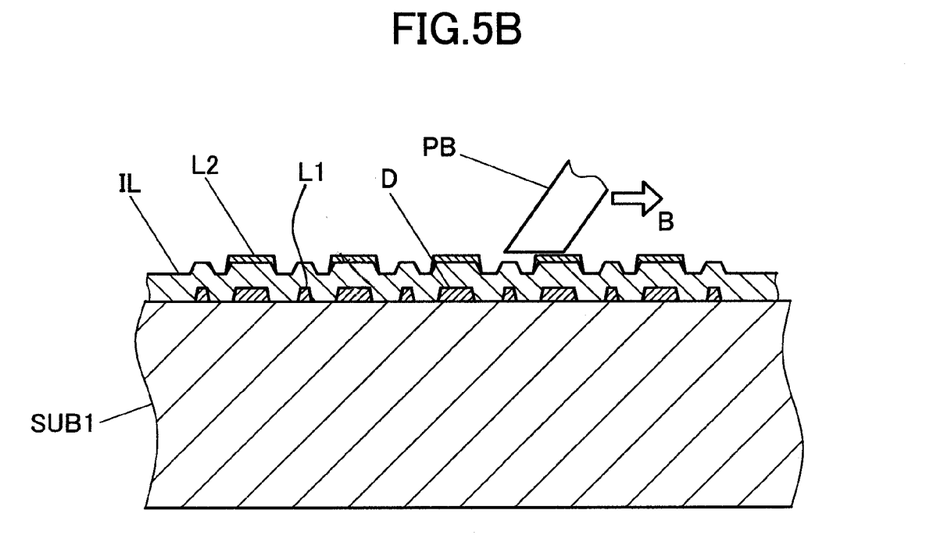
FIG. 5B is a view for explaining the display device of the first embodiment according to the present invention.

FIG. 5A and FIG. 5B are views showing a display device according to a first embodiment of the present invention, and shows an example where the adjustment layer D is arranged in a middle portion of the upper-layer line L2. FIG. 5B is a cross-sectional view showing a mode where a probe PB is moved along a chained line in FIG. 5A.

As shown in FIG. 5B, the surface of the upper-layer line L2 is positioned at the highest position on the substrate SUB1 and hence, even when the arrangement of lines is densified or even when a distal end of the probe PB is worn, the distal end of the probe PB is surely brought into contact with the upper-layer line L2.

Further, in FIG. 5A and FIG. 5B, a line width of the upper-layer line L2 and a width of the adjustment layer D are set larger than a line width of the upper-layer line L2 within the display region AR (see FIG. 4) and hence, the probe PB is more easily brought into contact with the upper-layer line L2 at the time of performing the contact-type wiring inspection.

Figure 6A:
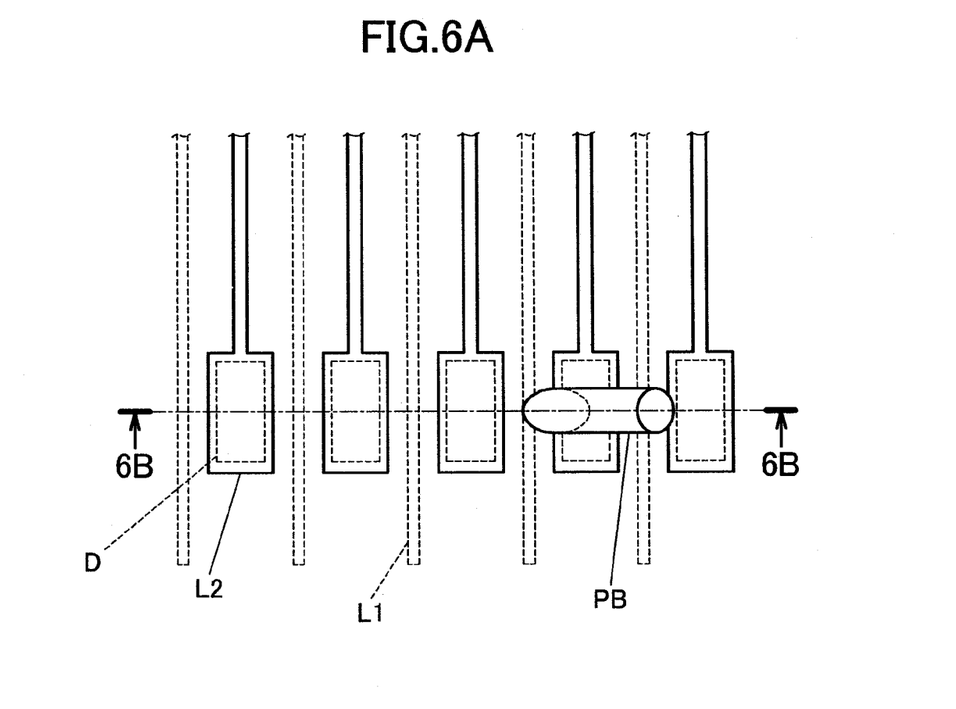
FIG. 6A is a view for explaining a display device of a second embodiment according to the present invention.
Figure 6B:
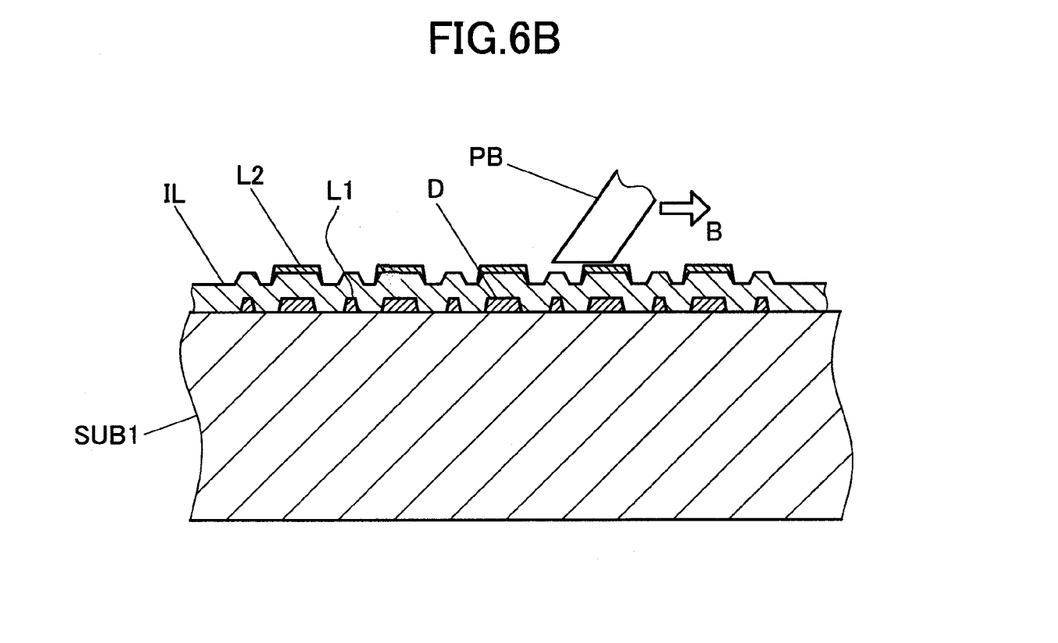
FIG. 6B is a view for explaining the display device of the second embodiment according to the present invention.

FIG. 6A and FIG. 6B are views showing a display device according to a second embodiment of the present invention, and show an example where the adjustment layer D is arranged in a connection pad portion of the upper-layer line L2. The display device according to the second embodiment is substantially equal to the display device according to the first embodiment with respect to other constitutions.

Figure 7A:
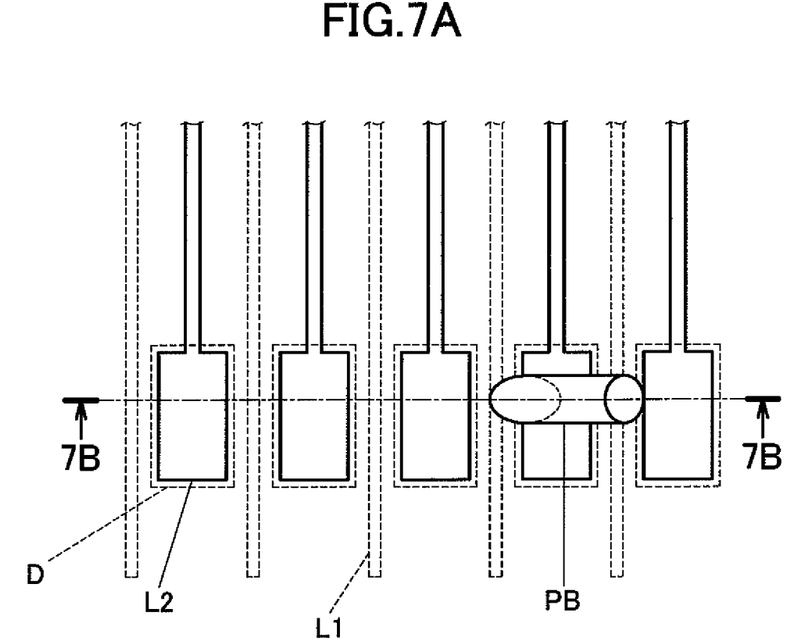
FIG. 7A is a view for explaining a display device of a third embodiment according to the present invention.
Figure 7B:
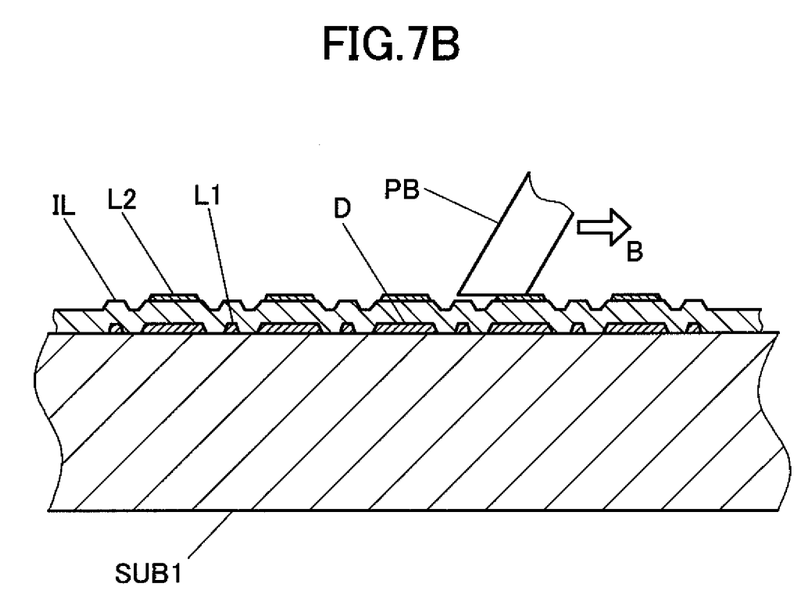
FIG. 7B is a view for explaining the display device of the third embodiment according to the present invention.
Figure 8A:
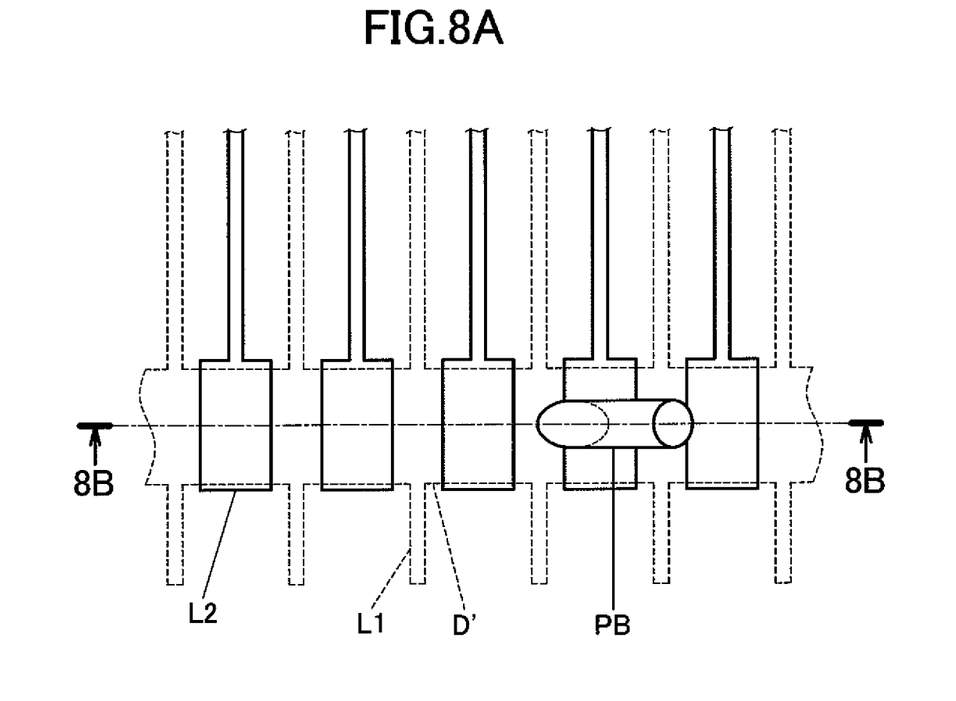
FIG. 8A is a view for explaining a display device of a fourth embodiment according to the present invention.
Figure 8B:
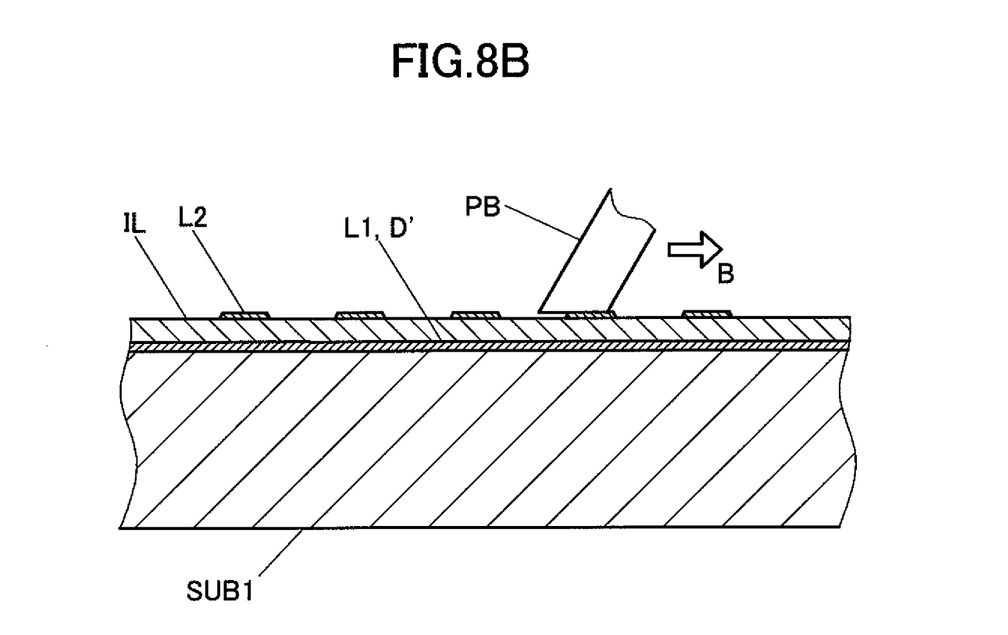
FIG. 8B is a view for explaining the display device of fourth embodiment according to the present invention.

FIG. 5A to FIG. 6B show an example where the width of the adjustment layer D is smaller than the line width of the upper-layer line L2. On the other hand, FIG. 7A and FIG. 7B show an example, as a third embodiment of the present invention, where a width of the adjustment layer D is set larger than a line width of the upper-layer line L2. When the line width of the upper-layer line L2 is small, it is preferable to set the width of the adjustment layer D larger than the line width thus surely increasing the height of the surface of the upper-layer line L2.

In the embodiments shown in FIG. 5A to FIG. 7B, the adjustment layers D is electrically isolated from the lower-layer lines L1 and the upper-layer lines L2. Accordingly, due to the presence of the adjustment layers D, when each line is operated, there is no possibility that a defect such as electric short-circuiting occurs. However, as in the case of a fourth embodiment shown in FIG. 8A and FIG. 8B, it is possible to make use of an adjustment layer D' as a connection line which connects the lower-layer lines L1 with each other. When a common line CT which constitutes a common line of the liquid crystal display device constitutes the lower-layer line L1, the adoption of the structure shown in FIG. 8A and FIG. 8B contributes to the establishment of the more reliable electrical connection between the common lines CT.

As has been explained heretofore, according to the present invention, in the display device in which two or more kinds of lines are arranged on the substrate by way of the interlayer insulation film, even when the arrangement of lines is highly densified or even when the distal end of the prove is worn, it is possible to provide the display device at which the contact-type wiring detection can be always accurately carried out.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a substrate;
   an interlayer insulation film on the substrate;
   a plurality of upper-layer lines which are arranged parallel to each other on an exposed top surface of the interlayer insulation film so that the plurality of upper-layer lines have exposed upper surfaces which are not covered;
   a plurality of lower-layer lines which are arranged on a bottom surface of the interlayer insulation film and between or adjacent to the plurality of upper-layer lines, the bottom surface of the interlayer insulation film being an opposite surface of the interlayer insulation film with respect to the exposed top surface of the interlayer insulation film; and
   a plurality of adjustment layers for adjusting a height of the plurality of upper-layer lines;
   wherein the plurality of adjustment layers are arranged on the bottom surface of the interlayer insulation film, below the plurality of upper-layer lines so as to raise an entirety of the exposed upper surfaces of the plurality of upper-layer lines to a highest position on the substrate as compared with all upper surfaces of the plurality of lower-layer lines, any portion of the exposed top surface of the interlayer insulation film and all upper surfaces of the plurality of adjustment layers;
   wherein the plurality of upper-layer lines, the plurality of lower-layer lines and the plurality of adjustment layers are in a partial region of the substrate outside a display region of the substrate.

2. The display device according to claim 1, wherein the partial region is a region outside of a sealing material region where the substrate is sealed to another substrate overlapping with the substrate, and the partial region having the exposed top surface of the interlayer insulation film with the upper-layer lines thereon having the exposed upper surfaces is configured so as to enable contact by a probe at a time of performing a contact-type wiring inspection.

3. The display device according to claim 2, wherein the adjustment layers are simultaneously formed with the lower-layer lines.

4. The display device according to claim 2, wherein the adjustment layer is electrically isolated.

5. The display device according to claim 3, wherein the adjustment layer is a connection portion which connects the lower-layer lines with each other.

6. The display device according to claim 2, wherein a line width of the upper-layer line and a width of the adjustment layer within the partial region are set larger than a line width of the upper-layer line within the display region.

7. The display device according to claim 2, wherein the display device is a liquid crystal display device, and the substrate is a substrate on which thin film transistors are formed, the lower-layer lines constitute common lines, and the upper-layer lines constitute drain lines or gate lines.

8. A display device comprising:
   a substrate;
   an interlayer insulation film on the substrate;
   a plurality of upper-layer lines which are arranged parallel to each other on an exposed top surface of the interlayer insulation film so that the plurality of upper-layer lines have exposed upper surfaces which are not covered;

a plurality of lower-layer lines which are arranged on a bottom surface of the interlayer insulation film and between or adjacent to the plurality of upper-layer lines;

wherein the plurality of lower-layer lines are electrically isolated from the plurality of upper-layer lines and are electrically isolated from a plurality of adjustment layers, the plurality of adjustment layers adjusting a height of the plurality of upper-layer lines;

wherein the plurality of adjustment layers are arranged on the bottom surface of the interlayer insulation film and below the plurality of upper-layer lines so as to raise an entirety of the exposed upper surfaces of the plurality of upper-layer lines to a highest position on the substrate as compared with all upper surfaces of the plurality of lower-layer lines, any portion of the exposed top surface of the interlayer insulation film and all upper surfaces of the plurality of adjustment layers;

wherein the plurality of upper-layer lines, the plurality of lower-layer lines and the plurality of adjustment layer, are in at least a partial region of the substrate outside a display region of the substrate;

wherein the partial region is a region having the exposed top surfaces of the plurality of upper-layer lines configured to enable contact by a probe brought into contact therewith at a time of performing a contact-type wiring inspection; and wherein the plurality of adjustment layers are electrically isolated layers with respect to the plurality of upper-layer lines or the plurality of lower-layer lines.

9. A display device comprising:

a substrate;

an interlayer insulation film on said substrate, wherein in at least a partial region of the substrate which is outside a display region of the substrate, a plurality of electrically conductive upper-layer lines are arranged parallel to each other on an exposed top surface of the interlayer insulation film so that the plurality of upper-layer lines have exposed upper surfaces which are not covered, and a plurality of electrically conductive lower-layer lines are arranged on a bottom surface of the interlayer insulation film and between or adjacent to the plurality of upper-layer lines, the bottom surface of the interlayer insulation film being an opposite surface of the interlayer insulation film with respect to the exposed top surface of the interlayer insulation film, wherein the plurality of lower-layer lines are electrically isolated from the plurality of upper-layer lines, and are electrically isolated from a plurality of adjustment layer, the plurality of adjustment layers adjusting a height of the plurality of upper-layer lines, the plurality of adjustment layers are arranged on the bottom surface of the interlayer insulation film and below the plurality of upper-layer lines so that the interlayer insulation film electrically insulates the plurality of upper-layer lines from the plurality of lower-layer lines, and wherein the plurality of adjustment layers are formed on the substrate so as to raise the exposed upper surfaces of the plurality of upper-layer lines to a highest position on the substrate as compared with all upper surfaces of the plurality of lower-layer lines, any portion of the exposed top surface of the interlayer insulation film and all upper surfaces of the plurality of adjustment layers.

10. The display device according to claim 9, wherein all the exposed upper surfaces of the plurality of upper-layer lines are an entirety of the upper surfaces of the plurality of upper-layer lines.

11. The display device according to claim 1, wherein the interlayer insulation film is adjacent to and on either side of the plurality of upper-layer lines, and wherein all the exposed upper surfaces of the plurality of upper-layer lines are at a position higher than any position of an exposed top surface of the interlayer insulation film.

* * * * *